(12) United States Patent
Lin et al.

(10) Patent No.: US 9,391,651 B1
(45) Date of Patent: Jul. 12, 2016

(54) AMPLIFIER WITH REDUCED HARMONIC DISTORTION

(71) Applicant: QUALCOMM Incorporated, San Diego, CA (US)

(72) Inventors: Saihua Lin, Santa Clara, CA (US); Chao Lu, Fremont, CA (US); Cheng-Han Wang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/680,756

(22) Filed: Apr. 7, 2015

(51) Int. Cl.
*H04B 1/04* (2006.01)

(52) U.S. Cl.
CPC ...... *H04B 1/0475* (2013.01); *H04B 2001/0408* (2013.01)

(58) Field of Classification Search
CPC ............... H04B 1/0475; H04B 1/0483; H04B 2001/0408
USPC ............. 455/501, 63.1, 91, 103, 114.1, 114.2
See application file for complete search history.

(56) References Cited

U.S. PATENT DOCUMENTS

| | | | |
|---|---|---|---|
| 8,493,102 B2 | 7/2013 | Balboni | |
| 2007/0087711 A1 | 4/2007 | Pan | |
| 2012/0250534 A1* | 10/2012 | Langer | H04B 17/13 370/252 |
| 2013/0109325 A1* | 5/2013 | Afsahi | H04B 17/13 455/73 |
| 2014/0057584 A1 | 2/2014 | Murphy et al. | |
| 2014/0286360 A1* | 9/2014 | McHenry | H03F 1/3229 370/537 |
| 2014/0329484 A1 | 11/2014 | Lau et al. | |
| 2014/0355728 A1 | 12/2014 | Liao et al. | |

FOREIGN PATENT DOCUMENTS

| | | |
|---|---|---|
| EP | 1560326 A1 | 8/2005 |
| WO | WO-2011019850 A1 | 2/2011 |
| WO | WO-2015013125 A1 | 1/2015 |

OTHER PUBLICATIONS

International Search Report and Written Opinion—PCT/US2016/017633—ISA/EPO—May 10, 2016.

* cited by examiner

*Primary Examiner* — Tuan Pham
(74) *Attorney, Agent, or Firm* — Paradice and Li LLP

(57) ABSTRACT

A method and apparatus are disclosed for a configurable amplifier. When operating in a first operating mode, the configurable amplifier may amplify a communication signal and may cancel or attenuate a second harmonic component associated with the communication signal. When operating in a second operating mode, the configurable amplifier may amplify the communication signal without cancelling or attenuating the second harmonic component associated with the communication signal.

30 Claims, 5 Drawing Sheets

AMPLIFIER WITH REDUCED HARMONIC DISTORTION

TECHNICAL FIELD

The present embodiments relate generally to communication devices, and specifically to amplifiers within communication devices that may amplify a signal while reducing harmonic distortion.

BACKGROUND OF RELATED ART

Communication devices may transmit and receive communication data through a communication medium. In one example, the communication medium may be a wireless communication medium where communication data is transmitted and received by communication devices according to a wireless communication protocol. Example wireless communication protocols may include IEEE 802.11 protocols and Bluetooth protocols according to the Bluetooth Special Interest Group. In another example, the communication medium may be a wired communication medium where the communication data is transmitted and received according to a wire-based communication protocol. Some example wire-based protocols may include an Ethernet® protocol and/or a Powerline Communications protocol described by the HomePlug 2.0 specification. In yet another example, the communication medium may be a hybrid combination of wired and wireless communication mediums.

Analog signals within communication devices may undergo amplification during various processing operations. For example, an analog signal may be amplified when a communication signal is received from or transmitted to another communication device. In some cases, as an analog signal is amplified, an unwanted signal may be introduced (e.g., added) to the amplified signal. For example, as a first signal is amplified, a second signal that is an unwanted harmonic of the first signal may also be amplified. The unwanted signal may distort the amplified signal, reducing the accuracy of the amplified signal and increasing the difficulty of receiving the amplified signal and decoding the data within the amplified signal. In some cases, the unwanted signal may couple into a sensitive receive and/or transmit circuit and interfere with the transmission and/or reception of the communication data.

Thus, there is a need to improve the amplification of analog signals while suppressing amplification of unwanted signals, and thereby improve the performance of the communication device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A configurable amplifier and method of operation are disclosed. The configurable amplifier may amplify a communication signal while cancelling or attenuating a second harmonic component of the communication signal. In one embodiment, the configurable amplifier may include a first processing chain to generate a first up-converted communication signal, a second processing chain to generate a second up-converted communication signal, and a summing node to generate an output signal of the configurable amplifier based, at least in part, on the first up-converted communication signal and the second up-converted communication signal. When the configurable amplifier is to operate in a first mode, the second up-converted communication signal is a substantially ninety degree phase-shifted version of the first up-converted communication signal. When the configurable amplifier is to operate in a second mode, the second up-converted communication signal is substantially similar to the first up-converted communication signal.

A wireless communication device is disclosed. The wireless communication device may include a baseband processor and a configurable amplifier, coupled to the baseband processor, to amplify communication signals, the configurable amplifier including: a first processing chain to generate a first up-converted communication signal, a second processing chain to generate a second up-converted communication signal, and a summing node to generate an output signal of the configurable amplifier based, at least in part, on the first up-converted communication signal and the second up-converted communication signal. When the configurable amplifier is to operate in a first mode, the second up-converted communication signal is a substantially ninety degree phase-shifted version of the first up-converted communication signal. When the configurable amplifier is to operate in a second mode, the second up-converted communication signal is substantially similar to the first up-converted communication signal.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

The present embodiments are described below in the context of Wi-Fi enabled devices for simplicity only. It is to be understood that the present embodiments are equally applicable for devices using signals of other various wireless standards or protocols. As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1:
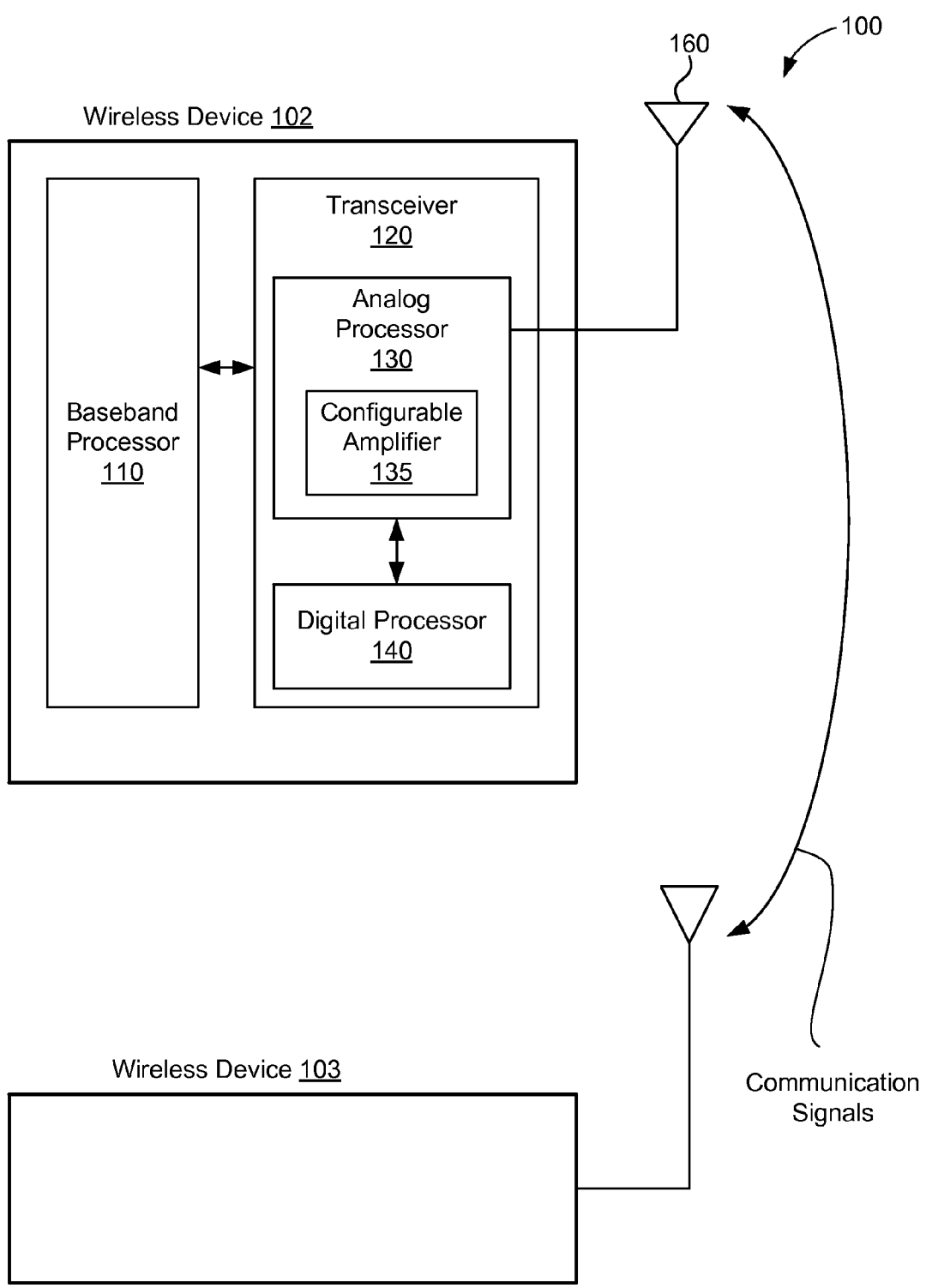
FIG. 1 depicts an example communication system within which example embodiments may be implemented.

FIG. 1 depicts an example communication system 100 within which example embodiments may be implemented. Communication system 100 may be a wireless system and may include wireless device 102 and wireless device 103. Although only two wireless devices 102 and 103 are shown for simplicity, communication system 100 may include any number of wireless devices. In other embodiments, communication system 100 may be a wired system and may include wired devices coupled to a wire or cable (not shown for simplicity). In still other embodiments, communication system 100 may be a hybrid system and may include both wireless and wired devices.

Wireless device 102 may include a transceiver 120, a baseband processor 110, and an antenna 160. Although not shown for simplicity, wireless device 102 may include a plurality of antennas. Baseband processor 110 may provide data to be transmitted to and/or receive data from one or more other devices via transceiver 120 and antenna 160. For example, baseband processor 110 may encode and/or decode the communication data for transmission and/or reception by transceiver 120.

Transceiver 120 may include a digital processor 140 and an analog processor 130. Digital processor 140 may receive the communication data from and provide the communication data to baseband processor 110. In some embodiments, the communication data may be processed according to a wireless communication protocol such as Wi-Fi, BLUETOOTH, near-field communication, Zig-Bee, or any other feasible wireless communication protocol. In other embodiments, the communication data may be processed according to a wired protocol such as an Ethernet, Powerline Communication (PLC), or any other feasible wired communication protocol. In still other embodiments, the communication data may be processed according to both a wireless and a wired communication protocol.

In some embodiments, analog processor 130 may be coupled to digital processor 140 and to antenna 160. Analog processor 130 may process communication data to and/or from digital processor 140. For example, analog processor 130 may process communication data from digital processor 140 for transmission through antenna 160 and/or analog processor 130 may process and provide communication data received through antenna 160 to digital processor 140.

Analog processor 130 may include a configurable amplifier 135 to amplify one or more communication signals. For example, configurable amplifier 135 may amplify a communication signal received through antenna 160. In another example, configurable amplifier 135 may amplify a communication signal to be transmitted from antenna 160. In some embodiments, configurable amplifier 135 may amplify the communication signal while suppressing unwanted harmonics of the communication signal. Operation of configurable amplifier 135 is described in more detail below in conjunction with FIG. 2.

Persons skilled in the art will recognize that an output signal of an amplifier, such as configurable amplifier 135, may be described with a power series of the form shown in eq. 1 below:

$$\text{Output}=gm1(S1)\cos\theta+gm2(S1)^2\cos^2\theta+gm3(S1)^3\cos^3\theta+\ldots \quad \text{(eq. 1)}$$

where: $gm(S1)\cos\theta$ is a first harmonic of the output signal (e.g., desired signal);
$gm2(S1)^2\cos^2\theta$ is a second harmonic of the output signal;
$gm3(S1)^3\cos^3\theta$ is a third harmonic of the output signal, and so forth.

The term "gm" may represent a gain of the amplifier associated with the first harmonic, the term "gm2" may represent a gain of the amplifier associated with the second harmonic, and so forth. The input signal to the amplifier may be represented by the term "$(S1)\cos\theta$".

In some embodiments, to reduce effects associated with the second harmonic component (e.g., the second harmonic of the output signal), the output signal may be based on the input signal $(S1)\cos\theta$ and a version of the input signal shifted by ninety (90) degrees (e.g., $(S1)\sin\theta$). Eq. 1 may be rewritten to express the output signal as a function of the input signal $(S1)\cos\theta$ (e.g., original input signal) and $(S1)\sin\theta$ (e.g., original input signal shifted by ninety degrees) as shown in eq. 2, below (note: eq. 2 is simplified to only include first and second harmonic terms):

$$\text{Output}=gm1(S1)\cos\theta+gm2(S1)^2\cos^2\theta+gm1(S1)\sin\theta+gm2(S1)^2\sin^2\theta \quad \text{(eq. 2)}$$

Eq. 2 may be rewritten to combine the first harmonic and the second harmonic terms as shown below in eq. 3:

$$\text{Output}=gm1(S1)\cos\theta+gm1(S1)\sin\theta+gm2(S1)^2\cos^2\theta+gm2(S1)^2\sin^2\theta \quad \text{(eq. 3)}$$

Simplifying eq. 3 gives:

$$\text{Output}=gm1(S1)(\cos\theta+\sin\theta)+gm2(S1)^2 \quad \text{(eq. 4)}$$

where: $gm1(S1)(\cos\theta+\sin\theta)$ is associated with the first harmonic, and
$gm2(S1)^2$ is associated with the second harmonic.

Note that the term associated with the second harmonic component has been simplified to a constant, and thus is no longer dependent on frequency. In other words, signals associated with a second harmonic distortion may be cancelled or substantially reduced when the input signal and a ninety degree shifted version of the input signal are processed at substantially the same time by the amplifier. Note also that the term associated with the first harmonic component has changed from "$gm1(S1)\cos\theta$" to "$gm1(S1)(\cos\theta+\sin\theta)$," for example, to indicate a change in the amplitude of the first harmonic component.

Figure 2:
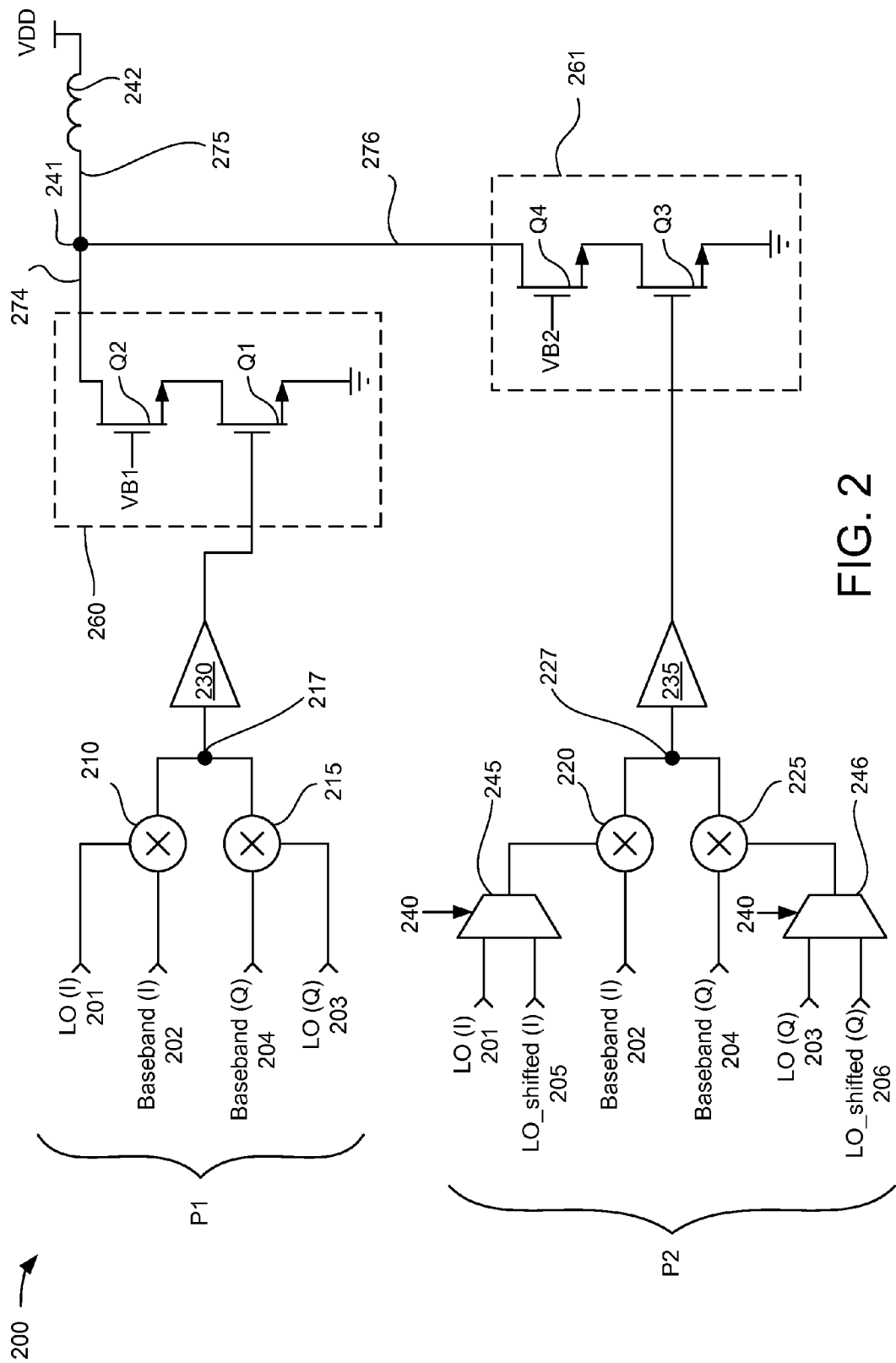
FIG. 2 shows a schematic diagram of a configurable amplifier, in accordance with example embodiments.

FIG. 2 shows a schematic diagram of a configurable amplifier 200, in accordance with example embodiments. Configurable amplifier 200 may be another embodiment of configurable amplifier 135 of FIG. 1. Configurable amplifier 200 may include a first processing path P1 and a second processing path P2. First processing path P1 may include a first mixer 210, a second mixer 215, a first buffer 230, a first summing node 217, and a first transistor pair 260. Second processing path P2 may include a third mixer 220, a fourth mixer 225, a first local oscillator (LO) signal selector 245, a second LO signal selector 246, a second buffer 235, a second summing node 227, and a second transistor pair 261. The first transistor pair 260 may be coupled to the second transistor pair 261 at a third summing node 241.

First processing path P1 may generate a first up-converted communication signal 274 and second processing path P2 may generate a second up-converted communication signal 276. Third summing node 241 may sum together first up-converted communication signal 274 and second up-converted communication signal 276 to generate a configurable amplifier output signal 275.

Configurable amplifier 200 may operate in a normal mode or in a cancelling mode. When configurable amplifier 200 operates in the normal mode, second up-converted communication signal 276 may be substantially similar to first up-converted communication signal 274. Thus, when configurable amplifier 200 operates in the normal mode, third summing node 241 may sum together first up-converted communication signal 274 and second up-converted communication signal 276 (substantially similar to the first up-converted communication signal 274) to generate configurable amplifier output signal 275.

When configurable amplifier 200 operates in the cancelling mode, second processing path P2 may generate second up-converted communication signal 276 to be a ninety degree phase-shifted version of first up-converted communication signal 274 generated by first processing path P1. Thus, when configurable amplifier 200 operates in the cancelling mode, third summing node 241 may sum together first up-converted communication signal 274 and a ninety degree phase-shifted version of first up-converted communication signal 276. The resulting summed signal, denoted as configurable amplifier output signal 275, may have a cancelled or reduced second harmonic distortion (based, at least in part, on eq. 4).

Thus, as described in more detail below, when configurable amplifier 200 operates in the cancelling mode, the second up-converted communication signal 276 may cancel at least second-order harmonics of the configurable amplifier output signal 275; when configurable amplifier 200 operates in the normal mode, the second up-converted communication signal 276 may increase the magnitude of the configurable amplifier output signal 275 (e.g., as compared to the output signal magnitude when configurable amplifier 200 operates in the cancelling mode).

First processing path P1 may mix together an LO signal and a baseband signal. In some embodiments, the LO signal and the baseband signal may be quadrature signals. For example, the LO signal may include an LO in-phase (I) signal 201 and an LO quadrature (Q) signal 203. In a similar manner, the baseband signal may include a baseband in-phase (I) signal 202 and a baseband quadrature (Q) signal 204. First mixer 210 may "mix" (e.g., multiply) together LO (I) signal 201 and baseband (I) signal 202 to generate a first mixer output signal that may be provided to first summing node 217. In a similar manner, second mixer 215 may mix together LO (Q) signal 203 and baseband (Q) signal 204 to generate a second mixer output signal that may be provided to first summing node 217. Output signals from first mixer 210 and second mixer 215 may be summed together at first summing node 217, and the resulting summed signal may be provided to first buffer 230.

First buffer 230 may be coupled to first transistor pair 260. First transistor pair 260 may amplify and/or buffer output signals from first buffer 230. First transistor pair 260 may include a first transistor Q1 and a second transistor Q2 configured as a cascode pair. In some embodiments, second transistor Q2 may include a gate terminal coupled to a bias voltage VB1. A gate terminal of first transistor Q1 may receive the output signal provided by first buffer 230, and a drain terminal of second transistor Q2 may provide an output signal (e.g., first up-converted communication signal 274) from first transistor pair 260 to third summing node 241.

Third summing node 241 may be coupled to output inductor 242. Output inductor 242 may receive configurable amplifier output signal 275 from third summing node 241, and output inductor 242 may be coupled to other circuits or devices (not shown for simplicity). For example, output inductor 242 may be coupled to an antenna, a balun, a coupler, or any other technically feasible device. Thus, in some embodiments, configurable amplifier output signal 275 may be provided to other circuits or devices through output inductor 242.

Although depicted with NMOS transistors, other embodiments of first transistor pair 260 may include any other technically feasible transistor types. For example, first transistor Q1 and/or second transistor Q2 may be a PMOS, an NPN, and/or a PNP transistor (not shown for simplicity). In still other embodiments, first transistor pair 260 may be replaced with other devices to amplify and/or buffer output signals from first buffer 230 or first summing node 217. For example, first transistor pair 260 may be replaced with an inverting amplifier, a voltage buffer, a current buffer, an operational amplifier, or any other technically feasible amplifier.

In a similar manner, when configurable amplifier 200 operates in the normal mode, second processing path P2 may also mix together the baseband signal and the LO signal. For example, LO (I) signal 201 may be selected by first LO signal selector 245 and provided to third mixer 220. First LO signal selector 245 may include switches, transistors, multiplexors, and/or any other technically feasible devices and/or components to select signals, such as LO (I) signal 201. Third mixer 220 may mix together LO (I) signal 201 and baseband (I) signal 202 and provide a third mixer output signal to second summing node 227. LO (Q) signal 203 may be selected by second LO signal selector 246 and provided to fourth mixer 225. Fourth mixer 225 may mix together LO (Q) signal 203 and baseband (Q) signal 204 and provide a fourth mixer output signal to second summing node 227. Output signals from third mixer 220 and fourth mixer 225 may be summed together at second summing node 227, and the resulting summed signal may be coupled to second buffer 235.

Second buffer 235 may be coupled to second transistor pair 261. Second transistor pair 261 may amplify and/or buffer output signals from second buffer 235. Second transistor pair 261 may include a third transistor Q3 and a fourth transistor Q4 configured as a cascode pair. In some embodiments, fourth transistor Q4 may include a gate terminal coupled to a bias voltage VB2. A gate terminal of third transistor Q3 may receive the output signal from second buffer 235, and a drain terminal of fourth transistor Q4 may provide an output signal (e.g., second up-converted communication signal 276) from second transistor pair 261 to third summing node 241.

Second up-converted communication signal 276 from second transistor pair 261 may be coupled to third summing node 241. Thus, third summing node 241 may sum together first up-converted communication signal 274 and second up-converted communication signal 276, thereby summing together output signals from first processing path P1 and second processing path P2.

When configurable amplifier 200 operates in the normal mode, first processing path P1 and second processing path P2 may each generate a substantially similar signal that may be summed together at third summing node 241. For example, the LO signal (including both in-phase and quadrature components) may be expressed by eq., 5 shown below:

$$\text{LO signal} = \cos \alpha - \sin \alpha \quad \text{(eq. 5)}$$

where: $-\sin \alpha$ is associated with LO (I) signal 201; and
$\cos \alpha$ is associated with LO (Q) signal 203.

Thus, the quadrature relationship between LO (I) signal 201 and LO (Q) signal 203 may be expressed by cosine and sine terms in eq. 5. In a similar manner, the baseband signal may be expressed by eq. 6, shown below:

$$\text{baseband signal} = \sin \beta + \cos \beta \qquad \text{(eq. 6)}$$

where: $\sin \beta$ is associated with baseband (I) signal 202; and
$\cos \beta$ is associated with baseband (Q) signal 204.

Thus, the quadrature relationship between baseband (I) signal 202 and baseband (Q) signal 204 may be described by sine and cosine terms in eq. 6.

An output signal from first processing path P1 may be expressed by eq. 7 shown below:

$$\text{output signal } P1 = \cos \alpha \cos \beta - \sin \alpha \sin \beta \qquad \text{(eq. 7)}$$

where: $\cos \alpha \cos \beta$ is associated with mixing LO (Q) signal 203 together with baseband (Q) signal 204; and
$\sin \alpha \sin \beta$ is associated with mixing LO (I) signal 201 together with baseband (I) signal 202.

When configurable amplifier 200 operates in the normal mode, first up-converted communication signal 274 and second up-converted communication signal 276 are substantially similar. Since configurable amplifier output signal 275 may be based on a sum of similar output signals from first processing path P1 and second processing path P2, the configurable amplifier output signal 275 may be expressed by eq. 8, shown below:

$$\text{configurable amplifier output signal } 275 = 2(\cos \alpha \cos \beta - \sin \alpha \sin \beta) \qquad \text{(eq. 8)}$$

Thus, because the first up-converted communication signal 274 and the second up-converted communication signal 276 are substantially similar and are summed at third summing node 241, the magnitude of the configurable amplifier output signal 275 may be increased relative to the output signal magnitude when configurable amplifier 200 operates in the cancelling mode.

As described above in conjunction with eq. 4, a second harmonic component of an output signal may be reduced or canceled by adding together a first signal and a ninety degree phase-shifted version of the first signal. Thus, when configurable amplifier 200 operates in the cancelling mode, second processing path P2 may be configured to generate second up-converted communication signal 276 to be a ninety degree phase-shifted version of first up-converted communication signal 274 provided by first processing path P1. In some embodiments, the LO signal used in second processing path P2 may be phase-shifted by ninety degrees with respect to the LO signal used in first processing path P1. For example, LO (I) signal 201 may be replaced with LO_shifted (I) signal 205, and LO (Q) signal 203 may be replaced with LO_shifted (Q) signal 206. In some embodiments, LO_shifted (I) signal 205 and LO_shifted (Q) signal 206 may be ninety degree phase-shifted versions of LO (I) signal 201 and LO (Q) signal 203, respectively. The phase-shifted LO signal may cause the output signal from second processing path P2 to be a phase-shifted version of the output signal from first processing path P1.

When configurable amplifier 200 operates in the cancelling mode, second processing path P2 may mix together the baseband signal and the shifted LO signal. For example, LO_shifted (I) signal 205 may be selected by first LO signal selector 245 and provided to third mixer 220. Third mixer 220 may mix together LO_shifted (I) signal 205 and baseband (I) signal 202 and provide the third mixer output signal to second summing node 227. LO_shifted (Q) signal 206 may be selected by second LO signal selector 246 and provided to fourth mixer 225. Fourth mixer 225 may mix together LO_shifted (Q) signal 206 and baseband (Q) signal 204 and provide the fourth mixer output signal to second summing node 227. Output signals from third mixer 220 and fourth mixer 225 may be summed together at second summing node 227 and the resulting summed signal provided to second buffer 235.

The first up-converted communication signal 274 output from first transistor pair 260 and the second up-converted communication signal 276 output from second transistor pair 261 may be summed together at third summing node 241. Referring back to eq. 5, a ninety degree phase-shifted LO signal may be expressed by eq. 9, shown below:

$$\text{LO\_shifted signal} = \sin \alpha + \cos \alpha \qquad \text{(eq. 9)}$$

where: $\cos \alpha$ is associated with LO_shifted (I) signal 205; and
$\sin \alpha$ is associated with LO_shifted (Q) signal 206.

Baseband signal may still be expressed by eq. 6. When configurable amplifier 200 operates in the cancelling mode, second processing path P2 may generate an output signal described by eq. 10 shown below:

$$\text{output signal } P2 = \sin \alpha \cos \beta - \cos \alpha \sin \beta \qquad \text{(eq. 10)}$$

where: $\sin \alpha \cos \beta$ is associated with mixing LO_shifted (Q) signal 206 together with baseband (Q) signal 204; and
$\cos \alpha \sin \beta$ is associated with mixing LO_shifted (I) signal 205 together with baseband (I) signal 202.

The output signal for first processing path P1 (eq. 7) may be rewritten as:

$$\cos(\alpha + \beta) = \cos \alpha \cos \beta - \sin \alpha \sin \beta \qquad \text{(eq. 11)}$$

In a similar manner, the output signal for second processing path P2 (eq. 10) may be rewritten as:

$$\sin(\alpha + \beta) = \sin \alpha \cos \beta + \cos \alpha \sin \beta \qquad \text{(eq. 12)}$$

Thus, configurable amplifier output signal 275 may be expressed by eq. 13 below:

$$\text{configurable amplifier output signal } 275 = \sin(\alpha + \beta) + \cos(\alpha + \beta) \qquad \text{(eq. 13)}$$

In other words, when configurable amplifier 200 operates in the cancelling mode, configurable amplifier output signal 275 is based, at least in part, on a first signal (e.g., $\sin(\alpha + \beta)$) and a ninety degree phase-shifted version of the first signal (e.g., $\cos(\alpha + \beta)$). Thus, configurable amplifier output signal 275 may have a reduced or cancelled second harmonic component.

Figure 3:
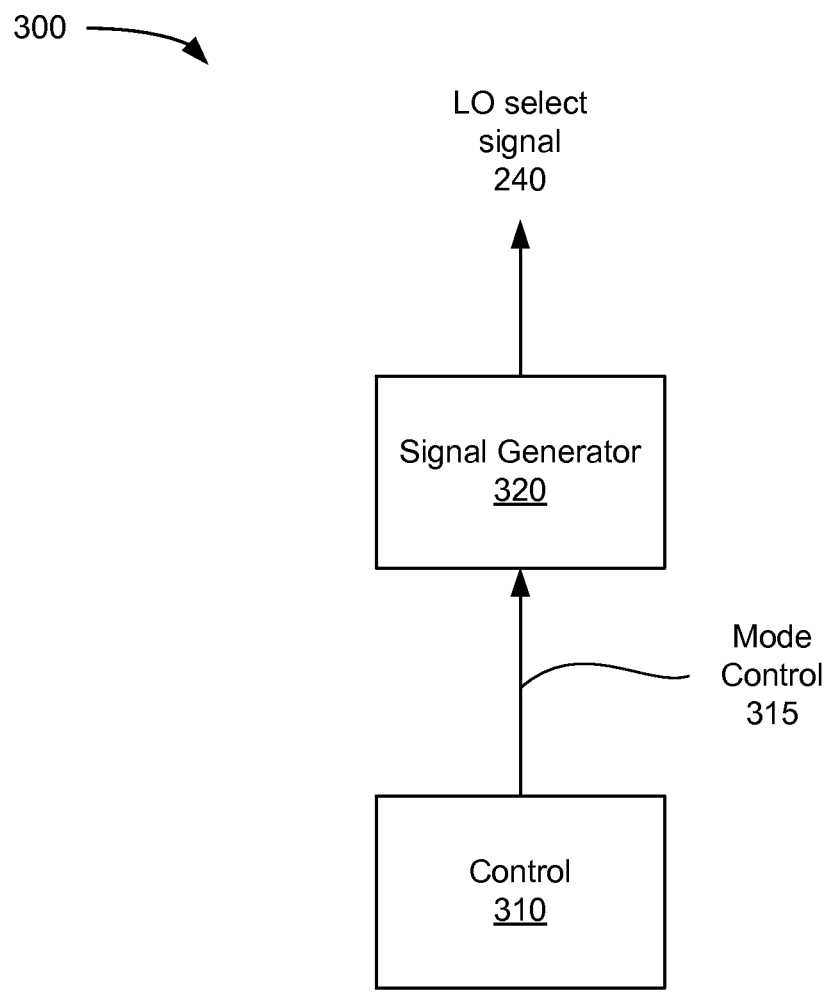
FIG. 3 is a block diagram of a mode controller, in accordance with example embodiments.

FIG. 3 is a block diagram of a mode controller 300, in accordance with example embodiments. Mode controller 300 may include a control block 310 and a signal generator 320. Control block 310 may drive a mode control signal 315 to a state that may cause configurable amplifier 200 to operate in the normal operating mode or the cancelling mode, as described above. In some embodiments, control block 310 may drive mode control signal 315 to a first state that may cause configurable amplifier 200 to operate in the normal operating mode when little or no cancelling of the second harmonic component of configurable amplifier output signal 275 is desired. Control block 310 may drive mode control signal 315 to a second state that may cause configurable amplifier 200 to operate in the cancelling mode when a cancelling or reduction of the second harmonic component of configurable amplifier output signal 275 is desired. For example, based on a characteristic frequency of an input signal for configurable amplifier 200, a second harmonic component of configurable amplifier output signal 275 may interfere with one or more devices and/or circuits within wireless device 102. Thus, configurable amplifier 200 may be operated in cancelling mode to reduce or cancel the second harmonic component and reduce any associated interference.

Signal generator 320 may receive mode control signal 315 and, in response thereto, may generate LO select signal 240. For example, in some embodiments, when configurable amplifier 200 operates in the normal mode, LO select signal 240 may not be asserted and/or be at a low logic level (or a first logical state) to enable first LO signal selector 245 and second LO signal selector 246 to select LO (I) signal 201 and LO (Q) signal 203, respectively. When configurable amplifier 200 operates in the cancelling mode, LO select signal 240 may be asserted and/or be at a high logic level (or a second logical state) to enable first LO signal selector 245 and second LO signal selector 246 to select LO_shifted (I) signal 205 and LO_shifted (Q) signal 206, respectively.

Figure 4:
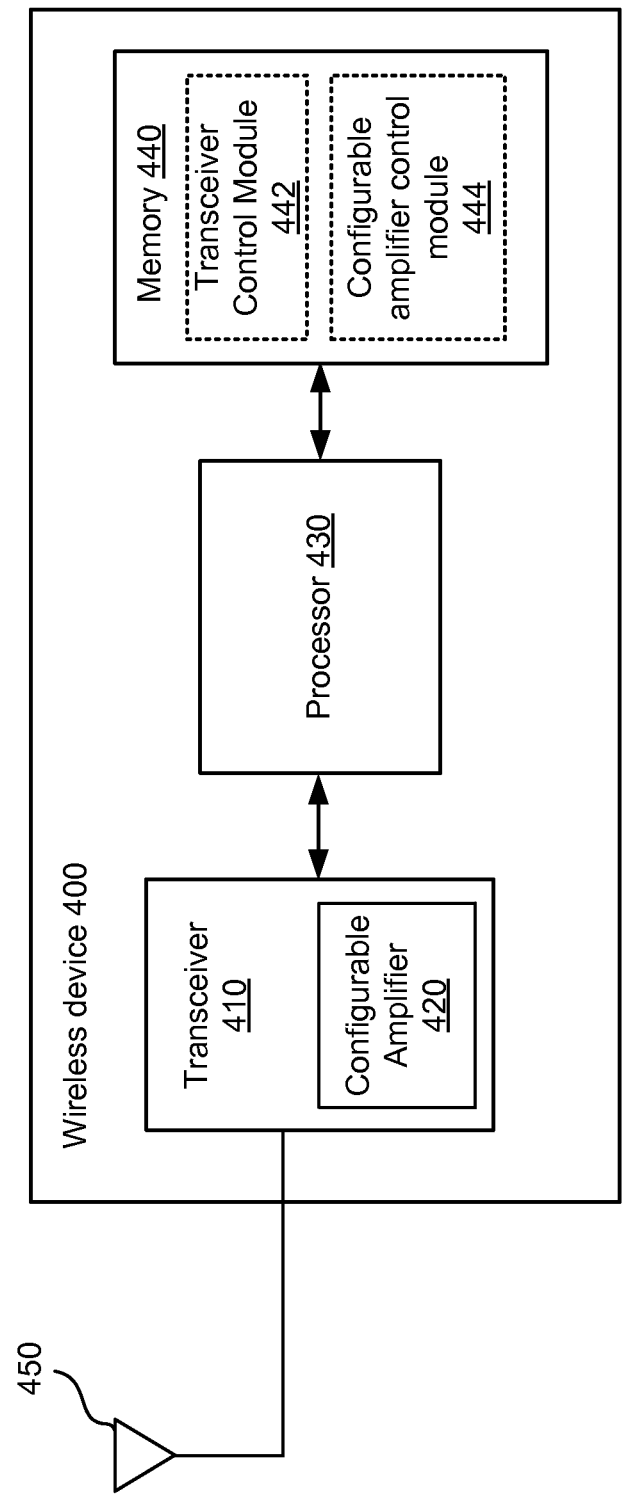
FIG. 4 shows a wireless device that is one embodiment of a wireless device of FIG. 1.

FIG. 4 shows a wireless device 400 that is one embodiment of wireless device 102 and/or 103 of FIG. 1. Wireless device 400 includes a transceiver 410, a processor 430, a memory 440, and one or more antennas 450. Transceiver 410 may transmit and receive communication signals. Transceiver 410 may include configurable amplifier 420 to amplify communication signals associated with transceiver 410. For some embodiments, configurable amplifier 420 may another embodiment of configurable amplifier 135 of FIG. 1 and/or configurable amplifier 200 of FIG. 2.

Memory 440 may include a non-transitory computer-readable storage medium (e.g., one or more nonvolatile memory elements, such as EPROM, EEPROM, Flash memory, a hard drive, etc.) that may store the following software modules:
  transceiver control module 442 to control transceiver 410 to transmit and receive communication signals in accordance with one or more communication protocols; and
  configurable amplifier control module 444 to control configurable amplifier 420 to amplify one or more communication signals within transceiver 410.

Each software module includes program instructions that, when executed by processor 430, may cause the wireless device 400 to perform the corresponding function(s). Thus, the non-transitory computer-readable storage medium of memory 440 may include instructions for performing all or a portion of the operations of FIG. 5.

Processor 430, which is coupled transceiver 410 and memory 440, may be any one or more suitable processors capable of executing scripts or instructions of one or more software programs stored in the wireless device 400 (e.g., within memory 440).

Processor 430 may execute transceiver control module 442 to configure transceiver 410 to receive and/or transmit communication signals in accordance with a communication protocol. In some embodiments, transceiver control module 442 may determine an operating frequency (e.g., carrier frequency) for transceiver 410.

Processor 430 may execute configurable amplifier control module 444 to select an operating mode for configurable amplifier 420. For example, based on a selected operating frequency used by transceiver 410, configurable amplifier control module 444 may determine an operating mode for configurable amplifier 420. In some embodiments, when a second harmonic frequency of a signal amplified by configurable amplifier 420 may interfere with another component and/or circuit within wireless device 400, then configurable amplifier control module 444 may operate configurable amplifier 420 in the cancelling mode. Conversely, when the second harmonic frequency of the signal amplified by configurable amplifier 420 may not interfere with another component and/or circuit within wireless device 400, then configurable amplifier control module 444 may operate configurable amplifier 420 in the normal mode.

Figure 5:
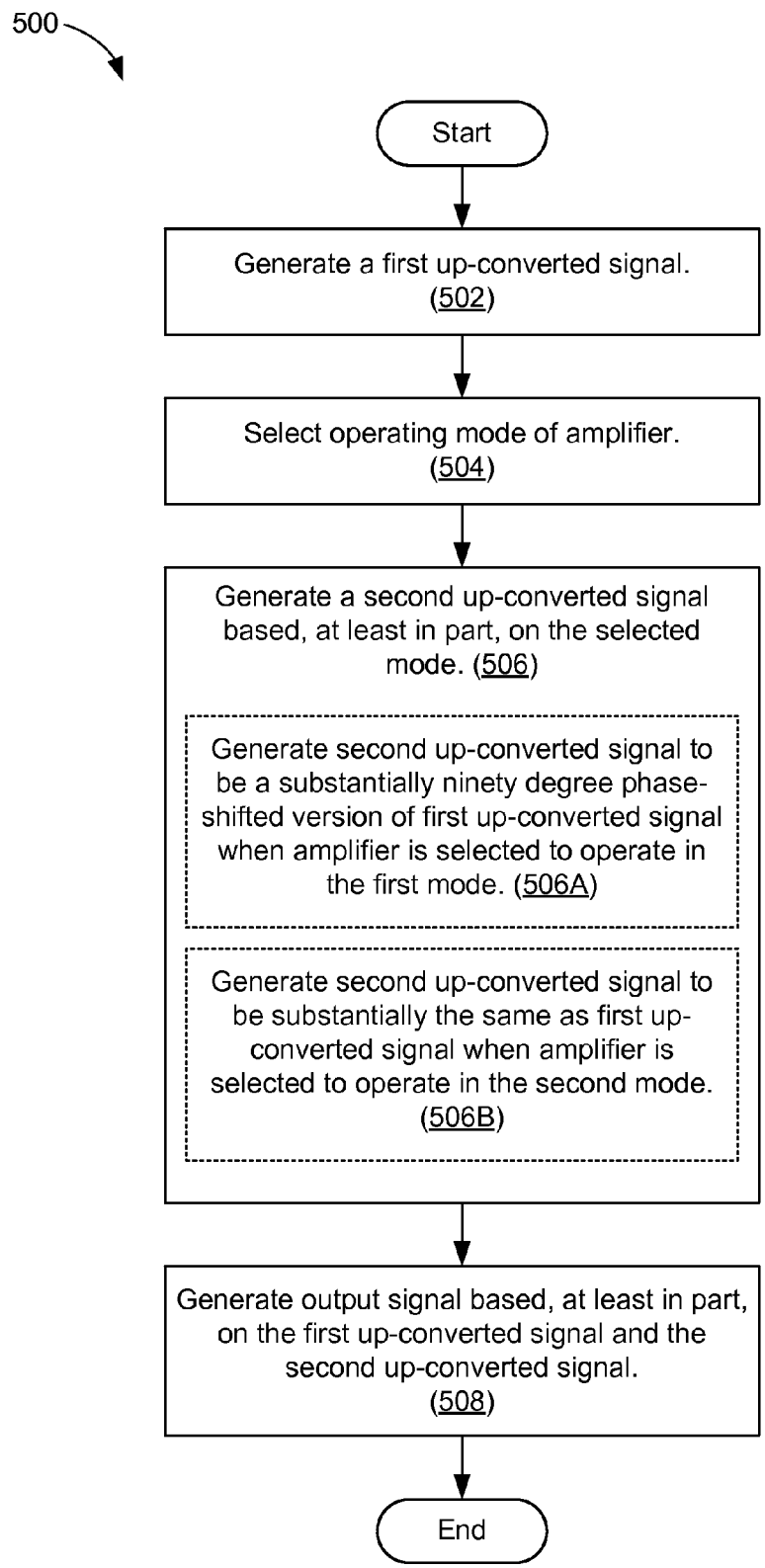
FIG. 5 shows an illustrative flow chart depicting an exemplary operation for operating a configurable amplifier, in accordance with example embodiments.

FIG. 5 shows an illustrative flow chart depicting an exemplary operation 500 for operating configurable amplifier 420, in accordance with example embodiments. Referring also to FIGS. 2-4, a first up-converted communication signal is generated (502). The first up-converted communication signal may be generated by first processing path P1, and may be based, at least in part, on a first local oscillator signal and a baseband signal. In some embodiments, the first local oscillator signal and the baseband signal may be quadrature signals.

An operating mode of the configurable amplifier 420 is selected (504). For example, when it is desired to cancel second-order harmonics of the output signal, then the first mode may be selected. Conversely, when it is not desired (or necessary) to cancel the second-order harmonics of the output signal (e.g., but rather to increase the magnitude of the output signal relative to the first mode), then the second mode may be selected.

Next, a second up-converted communication signal is generated (506). More specifically, for at least some example embodiments, when the configurable amplifier 420 is selected to operate in the first mode, the second up-converted communication signal is generated to be a substantially ninety degree phase-shifted version of the first up-converted communication signal (506A). Conversely, when the configurable amplifier 420 is selected to operate in the second mode, the second up-converted communication signal is generated to be substantially the same as the first up-converted communication signal (506B). Then, an output signal is generated based, at least in part, on the first up-converted communication signal and the second up-converted communication signal (508).

The first up-converted communication signal 274 may be based, at least in part, on a first local oscillator signal and a baseband signal, and the second up-converted communication signal 276 may be based, at least in part, on a second local oscillator signal and the baseband signal. In some embodiments, the second local oscillator signal may be a substantially ninety degree phase-shifted version of the first local oscillator signal when the configurable amplifier 420 is selected to operate in the first mode, and the second local oscillator signal may be substantially similar to the first local oscillator signal when the configurable amplifier 420 is selected to operate in the second mode. In some embodiments, the second local oscillator signal and the baseband signal may be quadrature signals.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A configurable amplifier, comprising:
  a first processing chain to generate a first up-converted communication signal;
  a second processing chain to generate a second up-converted communication signal; and
  a summing node to generate an output signal of the configurable amplifier based, at least in part, on the first up-converted communication signal and the second up-converted communication signal, wherein:

when the configurable amplifier is to operate in a first mode, the second up-converted communication signal is a substantially ninety degree phase-shifted version of the first up-converted communication signal; and when the configurable amplifier is to operate in a second mode, the second up-converted communication signal is substantially similar to the first up-converted communication signal.

2. The configurable amplifier of claim 1, wherein the first up-converted communication signal is based, at least in part, on a first local oscillator signal, and the second up-converted communication signal is based, at least in part, on a second local oscillator signal.

3. The configurable amplifier of claim 2, wherein:
when the configurable amplifier is to operate in the first mode, the second local oscillator signal is a substantially ninety degree phase-shifted version of the first local oscillator signal; and
when the configurable amplifier is to operate in the second mode, the second local oscillator signal is substantially the same as the first local oscillator signal.

4. The configurable amplifier of claim 1, wherein:
when the configurable amplifier is to operate in the first mode, the second up-converted communication signal is to cancel at least second-order harmonics of the output signal; and
when the configurable amplifier is to operate in the second mode, the second up-converted communication signal is to increase a magnitude of the output signal.

5. The configurable amplifier of claim 1, further comprising:
a control block to generate a mode control signal based on an operating mode of the configurable amplifier.

6. The configurable amplifier of claim 5, wherein:
the control block is to drive the mode control signal to a first state when the output signal of the configurable amplifier is to have an attenuated second harmonic component; and
the control block is to drive the mode control signal to a second state when the output signal of the configurable amplifier is to have an unattenuated second harmonic component.

7. The configurable amplifier of claim 1, wherein the first up-converted communication signal and the second up-converted communication signal are based, at least in part, on a quadrature baseband signal and a quadrature local oscillator signal.

8. The configurable amplifier of claim 1, wherein the second processing chain is to generate the second up-converted communication signal based, at least in part, on a baseband signal and a local oscillator signal.

9. The configurable amplifier of claim 8, wherein the second processing chain comprises:
a signal selector to select a first local oscillator signal as the local oscillator signal when the configurable amplifier is to operate in the first mode, and to select a second local oscillator signal as the local oscillator signal when the configurable amplifier is to operate in the second mode.

10. The configurable amplifier of claim 9, wherein:
when the configurable amplifier is to operate in the first mode, the second local oscillator signal is a substantially ninety degree phase-shifted version of the first local oscillator signal; and
when the configurable amplifier is to operate in the second mode, the second local oscillator signal is substantially the same as the first local oscillator signal.

11. The configurable amplifier of claim 1, further comprising:
a first transistor pair to buffer the first up-converted communication signal; and
a second transistor pair to buffer the second up-converted communication signal.

12. A wireless communication device comprising:
a baseband processor; and
a configurable amplifier, coupled to the baseband processor, to amplify communication signals, the configurable amplifier comprising:
a first processing chain to generate a first up-converted communication signal;
a second processing chain to generate a second up-converted communication signal; and
a summing node to generate an output signal of the configurable amplifier based, at least in part, on the first up-converted communication signal and the second up-converted communication signal, wherein:
when the configurable amplifier is to operate in a first mode, the second up-converted communication signal is a substantially ninety degree phase-shifted version of the first up-converted communication signal; and
when the configurable amplifier is to operate in a second mode, the second up-converted communication signal is substantially similar to the first up-converted communication signal.

13. The wireless communication device of claim 12, wherein the first up-converted communication signal is based, at least in part, on a first local oscillator signal, and the second up-converted communication signal is based, at least in part, on a second local oscillator signal.

14. The wireless communication device of claim 13, wherein:
when the configurable amplifier is to operate in the first mode, the second local oscillator signal is a substantially ninety degree phase-shifted version of the first local oscillator signal; and
when the configurable amplifier is to operate in the second mode, the second local oscillator signal is substantially the same as the first local oscillator signal.

15. The wireless communication device of claim 12, wherein:
when the configurable amplifier is to operate in the first mode, the second up-converted communication signal is to cancel at least second-order harmonics of the output signal; and
when the configurable amplifier is to operate in the second mode, the second up-converted communication signal is to increase a magnitude of the output signal.

16. The wireless communication device of claim 12, further comprising:
a control block to generate a mode control signal based on an operating mode of the configurable amplifier.

17. The wireless communication device of claim 16, wherein:
the control block is to drive the mode control signal to a first state when the output signal of the configurable amplifier is to have an attenuated second harmonic component; and
the control block is to drive the mode control signal to a second state when the output signal of the configurable amplifier is to have an unattenuated second harmonic component.

18. The wireless communication device of claim 12, wherein the second processing chain is to generate the second up-converted communication signal based, at least in part, on a baseband signal and a local oscillator signal.

19. The wireless communication device of claim 18, wherein the second processing chain comprises:
a signal selector to select a first local oscillator signal as the local oscillator signal when the configurable amplifier is to operate in the first mode, and to select a second local oscillator signal as the local oscillator signal when the configurable amplifier is to operate in the second mode.

20. The wireless communication device of claim 19, wherein:
when the configurable amplifier is to operate in the first mode, the second local oscillator signal is a substantially ninety degree phase-shifted version of the first local oscillator signal; and
when the configurable amplifier is to operate in the second mode, the second local oscillator signal is substantially the same as the first local oscillator signal.

21. A method of operating a configurable amplifier, the method comprising:
generating a first up-converted communication signal;
selecting an operating mode of the configurable amplifier;
generating a second up-converted communication signal based, at least in part, on the selected operating mode by:
generating the second up-converted communication signal to be a substantially ninety degree phase-shifted version of the first up-converted communication signal when the configurable amplifier is selected to operate in a first mode; and
generating the second up-converted communication signal to be substantially the same as the first up-converted communication signal when the configurable amplifier is selected to operate in a second mode; and
generating, at a summing node, an output signal for the configurable amplifier based, at least in part, on the first up-converted communication signal and the second up-converted communication signal.

22. The method of claim 21, wherein the first up-converted communication signal is based, at least in part, on a first local oscillator signal, and the second up-converted communication signal is based, at least in part, on a second local oscillator signal.

23. The method of claim 22, further comprising:
generating the second local oscillator signal as a substantially ninety degree phase-shifted version of the first local oscillator signal when the configurable amplifier is selected to operate in the first mode; and
generating the second local oscillator signal as substantially the same as the first local oscillator signal when the configurable amplifier is selected to operate in the second mode.

24. The method of claim 21, wherein:
when the configurable amplifier is selected to operate in the first mode, the second up-converted communication signal is to cancel at least second-order harmonics of the output signal; and
when the configurable amplifier is selected to operate in the second mode, the second up-converted communication signal is to increase a magnitude of the output signal.

25. The method of claim 21, wherein the selecting comprises:
selecting the first mode when the output signal is to have an attenuated second harmonic component; and
selecting the second mode when the output signal is to have an unattenuated second harmonic component.

26. A non-transitory computer-readable medium storing instructions that, when executed by one or more processors of a wireless device comprising at least a configurable amplifier, causes the wireless device to:
generate a first up-converted communication signal;
select an operating mode of the configurable amplifier;
generate a second up-converted communication signal based, at least in part, on the selected operating mode by:
generating the second up-converted communication signal to be a substantially ninety degree phase-shifted version of the first up-converted communication signal when the configurable amplifier is selected to operate in a first mode; and
generating the second up-converted communication signal to be substantially the same as the first up-converted communication signal when the configurable amplifier is selected to operate in a second mode; and
generate, at a summing node, an output signal for the configurable amplifier based, at least in part, on the first up-converted communication signal and the second up-converted communication signal.

27. The non-transitory computer-readable medium of claim 26, wherein the first up-converted communication signal is based, at least in part, on a first local oscillator signal, and the second up-converted communication signal is based, at least in part, on a second local oscillator signal.

28. The non-transitory computer-readable medium of claim 27, wherein execution of the instructions by the one or more processors causes the wireless device to:
generate the second local oscillator signal as a substantially ninety degree phase-shifted version of the first local oscillator signal when the configurable amplifier is selected to operate in the first mode; and
generate the second local oscillator signal as substantially the same as the first local oscillator signal when the configurable amplifier is selected to operate in the second mode.

29. The non-transitory computer-readable medium of claim 26, wherein:
when the configurable amplifier is selected to operate in the first mode, the second up-converted communication signal is to cancel at least second-order harmonics of the output signal; and
when the configurable amplifier is selected to operate in the second mode, the second up-converted communication signal is to increase a magnitude of the output signal.

30. The non-transitory computer-readable medium of claim 26, wherein execution of the instructions to select the operating mode causes the wireless device to:
select the first mode when the output signal is to have an attenuated second harmonic component; and
select the second mode when the output signal is to have an unattenuated second harmonic component.

* * * * *